US008912957B2

(12) United States Patent
Lin

(10) Patent No.: US 8,912,957 B2
(45) Date of Patent: Dec. 16, 2014

(54) RECONFIGURABLE MILLIMETER WAVE MULTIBEAM ANTENNA ARRAY

(75) Inventor: Saihua Lin, Sunnyvale, CA (US)

(73) Assignee: QUALCOMM Incorporated, San Diego, CA (US)

( * ) Notice: Subject to any disclaimer, the term of this patent is extended or adjusted under 35 U.S.C. 154(b) by 439 days.

(21) Appl. No.: 13/316,951

(22) Filed: Dec. 12, 2011

(65) Prior Publication Data

US 2013/0147664 A1 Jun. 13, 2013

(51) Int. Cl.
*H01Q 3/00* (2006.01)
*H01Q 3/38* (2006.01)

(52) U.S. Cl.
USPC .......................................... 342/368; 342/372

(58) Field of Classification Search
CPC ........ H01Q 3/26; H01Q 3/2605; H01Q 3/267
USPC ............. 342/81, 154, 368, 372, 373; 343/853
See application file for complete search history.

(56) References Cited

U.S. PATENT DOCUMENTS

| | | | |
|---|---|---|---|
| 6,661,284 B1 | 12/2003 | Luz et al. | |
| 6,922,169 B2 | 7/2005 | Mohd Izzat et al. | |
| 7,280,084 B2 | 10/2007 | Herbert et al. | |
| 7,830,312 B2 | 11/2010 | Choudhury et al. | |
| 7,852,281 B2 | 12/2010 | Choudhury | |
| 2008/0029886 A1 | 2/2008 | Cotte et al. | |
| 2008/0079636 A1 | 4/2008 | Mohamadi | |
| 2008/0291115 A1 | 11/2008 | Doan et al. | |
| 2010/0033393 A1 | 2/2010 | Myszne et al. | |
| 2011/0135308 A1 | 6/2011 | Tarlazzi et al. | |
| 2011/0205119 A1 | 8/2011 | Timofeev et al. | |

FOREIGN PATENT DOCUMENTS

| | | |
|---|---|---|
| WO | 0129926 A1 | 4/2001 |
| WO | 2005048401 A1 | 5/2005 |

OTHER PUBLICATIONS

Amadjikpe, et al., "High Gain Quasi-Yagi Planar Antenna Evaluation in Platform Material Environment for 60 GHz Wireless Applications," IEEE IMS 2009, pp. 385-388.
Amadjikpe, et al., "Location Specific Coverage With Wireless Platform Integrated 60-GHz Antenna Systems," IEEE Transactions on Antennas and Propagation, vol. 59, No. 7, Jul. 2011, pp. 2661-2671.
International Search Report and Written Opinion—PCT/US2012/069293—ISA/EPO—Apr. 24, 2013.

*Primary Examiner* — Dao Phan
(74) *Attorney, Agent, or Firm* — Ramin Morbarhan

(57) ABSTRACT

A reconfigurable millimeter wave multibeam antenna array is disclosed. In an exemplary embodiment, an apparatus is provided that includes a first millimeter (MM) wave antenna, a second MM wave antenna, and a hybrid coupler coupled to the first and second MM wave antennas, the hybrid coupler configured to receive a MM wave transmit signal and a phase shifted version of the MM wave transmit signal, and to direct power to the first and second MM wave antennas based on a phase difference between the MM wave transmit signal and the phase shifted version of the MM wave transmit signal.

19 Claims, 5 Drawing Sheets

RECONFIGURABLE MILLIMETER WAVE MULTIBEAM ANTENNA ARRAY

BACKGROUND

1. Field

The present application relates generally to the operation and design of antenna systems for use with mobile devices, and more particularly, to a millimeter (MM) wave antenna for use with mobile devices.

2. Background

There is an increasing demand to have mobile devices capable of high quality transmission and reception. One key to achieving high quality is associated with the performance of the antenna system. For example, it is desirable to have a high performance antenna system in a mobile device that can operate at frequencies in the millimeter wavelength range, (i.e., ten to one millimeters), which is extremely high frequency in the range of 30 to 300 gigahertz.

Unfortunately, the small size of typical mobile devices limits the placement and/or type of antenna array that may be used. For example, simple planar antennas, which may fit into the available space, may not provide the desired transmission patterns and/or performance at MM wave frequencies. Also, antenna systems designed to operate at lower frequencies may utilize mechanical switches that may be too large and have too much loss to be effective at MM wave frequencies.

Therefore, it is desirable to have a small size and low cost MM wave reconfigurable multi-beam antenna array for use in mobile devices.

BRIEF DESCRIPTION OF THE DRAWINGS

The foregoing aspects described herein will become more readily apparent by reference to the following description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

The exemplary embodiments disclosed herein provide a MM wave reconfigurable antenna array that includes first and second antenna arrays, both of which are capable of beam steering. An integrated circuit applies on-chip phase adjustment and by using hybrid couplers, power to the antennas can be selectively controlled without the use of mechanical switches. Using a first set of phase shifters, the power directed to each antenna array beam can be controlled. Using a second set of phase shifters, the direction of the radiation beam patterns can be controlled. Thus, reconfigurable antenna array also provides antenna diversity and interference cancellation and during antenna switching, changes to the power amplifier (PA)/low noise amplifier (LNA) load impedance is minimally effected.

Figure 1:
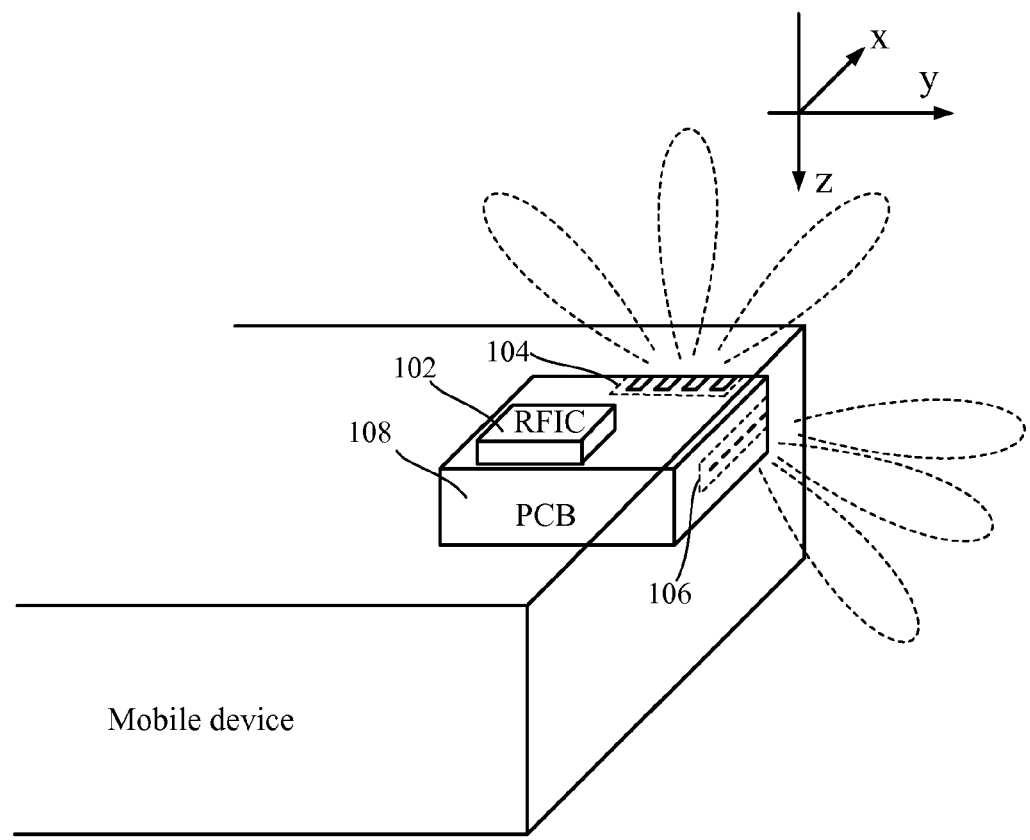
FIG. 1 shows an exemplary embodiment of a millimeter (MM) wave reconfigurable multi-beam antenna array for use in a mobile device.

FIG. 1 shows an exemplary implementation of a MM wave reconfigurable multi-beam antenna array for use in a mobile device. A circuit board (PCB) 108 is located within a mobile device and comprises a first MM wave antenna array 104 and a second MM wave antenna array 106. The first MM wave antenna array 104 is formed on a surface of the circuit board and is configured to generate a radiation beam pattern in the Y-Z plane. The second MM wave antenna array is formed at the edge of an interior surface of the circuit board and is configured to generate a radiation beam pattern in the X-Y plane. In an exemplary embodiment, the MM wave antenna arrays 104, 106 comprise one or more radiating elements. For example, the first MM wave antenna array 104 can be a planar array comprising a plurality of array elements printed on a surface of the circuit board in a linear or rectangular shape. The second MM wave antenna array 106 can be an edge mounted array comprising a plurality of array elements formed at the edge of the circuit board between layers. In an exemplary embodiment, the antenna arrays 104 and 106 can be patch, edge-fired or wave-guide antenna arrays.

An integrated circuit (RFIC) 102 is also mounted to the circuit board and is coupled to the first 104 and second 106 antenna arrays. The integrated circuit 102 operates to adjust the power and the radiation beam patterns associated with each antenna array. As discussed in more detail below, the circuit 102 utilizes phase shifters and hybrid antenna couplers to control the power directed to each antenna array and to control the resulting beam patterns. The antenna arrays (104 and 106) and circuit 102 are configured for MM wave operation. Thus, by incorporating the antenna arrays onto and within the printed circuit board and by utilizing an integrated circuit also mounted onto the printed circuit board to drive and control the two antenna arrays, a cost and space efficient MM wave antenna system for use with mobile devices results.

Figure 2:
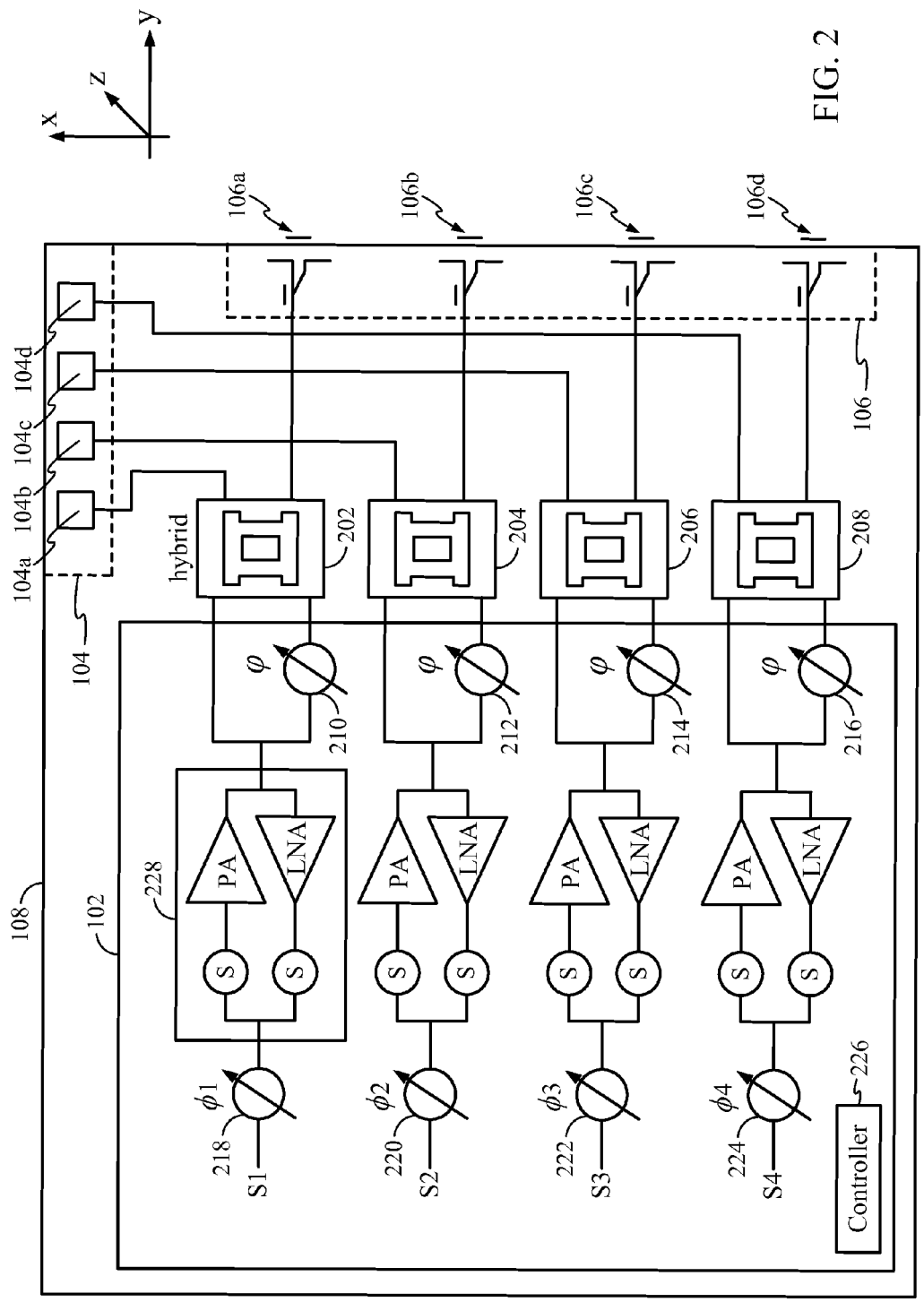
FIG. 2 shows a top view of the embodiment of the millimeter (MM) wave reconfigurable multi-beam antenna array shown in FIG. 1.

FIG. 2 shows a detailed top view of the millimeter (MM) wave reconfigurable multi-beam antenna array shown in FIG. 1. The integrated circuit 102 comprises four signal paths that carry signals (S1-S4) between device electronics and the antenna arrays 104 and 106. For example, in one embodiment, the input signals S1-S4 are baseband signals and in another embodiment, the input signals S1-S4 are RF signals. The four signal paths include four hybrid couplers 202, 204, 206, and 208, respectively. Each hybrid coupler is coupled to receive a transmit signal to be transmitted and a phase shifted version of the transmit signal. For example, four power distribution phase shifters 210, 212, 214, and 216 provide phase shifted versions of the transmit signals to the hybrid couplers 202, 204, 206, and 208. In one embodiment, the amount of phase shift provided by the four phase shifters 210, 212, 214, and 216 is identical.

The phase shifters 210, 212, 214, and 216 introduce a selected amount of phase shift between the transmit signals and the phase shifted versions of the transmit signals. The hybrid couplers 202, 204, 206, and 208 utilized the difference in phase to control how power is distributed to each of the antenna arrays 104 and 106. For example, the antenna array 104 comprises array elements 104a-104d and the antenna array 106 comprises array elements 106a-106d. Each hybrid coupler has outputs connected to one antenna element of the antenna 104 and one antenna element of the antenna 106. For example, the hybrid coupler 202 has one output connected to array element 104a and a second output connected to array element 106a. The phase difference between the signals received by each hybrid coupled control how power is distributed to the antenna elements to which it is connected.

The circuit 102 also includes four transceivers, such as transceiver 228. Each transceiver comprises two switches (S) that are connected to a power amplifier (PA) and a low noise amplifier (LNA) and are used to connect and enable either a transmit signal path through the PA or a receive signal path through the LNA. The output of the transceiver 228 is input to the hybrid coupler 202 and the power distribution phase shifter 210. It should be noted that if the input signals S1-S4 comprise baseband signals, then the transceivers include upconverters and downconverters. If the input signals S1-S4 comprise RF signals then the transceivers are configured without upconverters and downconverters.

A second set of phase shifters referred to as beam steering phase shifters 218, 220, 222, and 224 are connected to shift the phases of the input signals S1-S4 before they are input to the transceivers. The beam steering phase shifters 218, 220, 222, and 224 operate to adjust the beam pattern of the antennas 104 and 106. For example, each of the phase shifters 218, 220, 222, and 224 can be set to provide a different amount of phase shift which determines the direction of the beam pattern produced by the antennas 104 and 106. A controller 226 operates to control all the phase shifters and switches of the circuit 102. It should be noted that although the functions of the MM wave antenna shown in FIG. 2 have been described with respect to transmitting signals, the functional elements described operate in an opposite but corresponding manner when receiving signals. A more detailed description of the operation of the circuit 102 is provided below.

Figure 3:
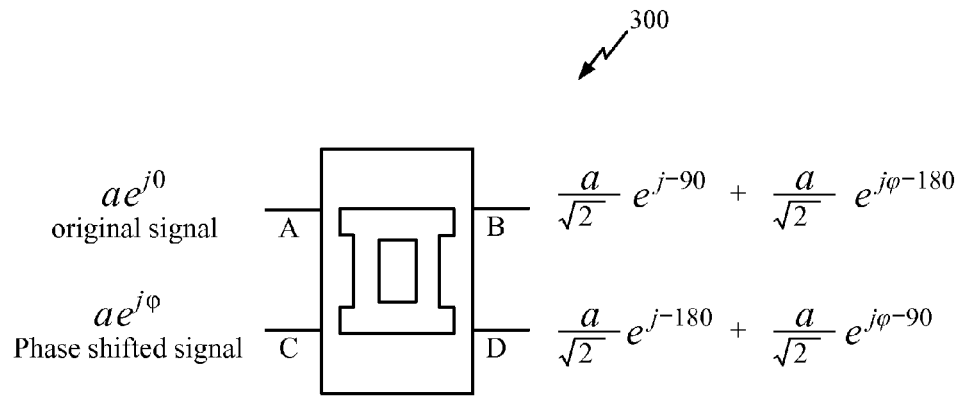
FIG. 3 shows an exemplary embodiment of a hybrid coupler for use with the MM wave reconfigurable multi-beam antenna array shown in FIG. 2.

FIG. 3 shows an exemplary hybrid coupler 300 for use with the MM wave reconfigurable multi-beam antenna array shown in FIG. 2. For example, the hybrid coupler 300 is referred to as a 90-degree ring hybrid and is suitable for use as any of the hybrid couplers 202, 204, 206 or 208. In an exemplary embodiment, the hybrid coupler 300 receives input signals at its A and C inputs and produces output signals at its B and D outputs. For example, the input signals may be the signal to be transmitted and the phase shifted version of the signal to be transmitted shown in FIG. 2. The signals output from the outputs B and D may be coupled to elements of the antenna arrays 104 and 106, respectively.

As shown in FIG. 3, the input A is coupled to receive an input signal with zero phase shift, and the input C is coupled to receive a phase shifted version of the input signal, which is shift in phase by ($\phi$). The phase shift ($\phi$) is set by the phase shifters 210, 212, 214, and 216 shown in FIG. 2 and controls the allocation of power between the antennas 104 and 106 to achieve the power distributions represented by the equations shown in FIG. 3. For example, when ($\phi$) is set to provide −90, 90, or 0 degrees of phase shift, the following power distributions between the antenna 104 and the antenna 106 are provided.

Figure 4:
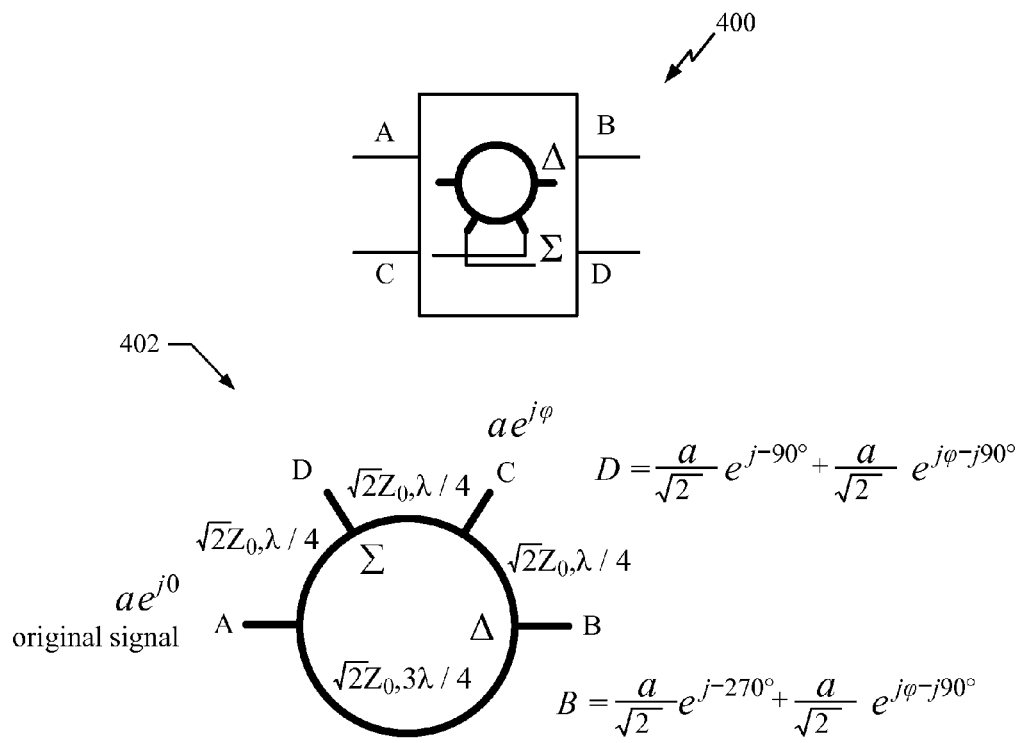
FIG. 4 shows an exemplary embodiment of a hybrid coupler for use with the MM wave reconfigurable multi-beam antenna array shown in FIG. 2.

If $\phi=-90$ then, B=0, D=$\sqrt{2}ae^{-j180°}$ to side antenna (106)
If $\phi=90$ then, D=0, B=$\sqrt{2}ae^{-j90°}$ to top antenna (104)
If $\phi=0$ then both antennas (104 and 106) will receive equal power FIG. 4 shows an exemplary hybrid coupler 400 for use with the MM wave reconfigurable multi-beam antenna array shown in FIG. 2. For example, the hybrid coupler 400 is referred to as a 180-degree ring hybrid and is suitable for use as any of the hybrid couplers 202, 204, 206 or 208. In an exemplary embodiment, the hybrid coupler 400 receives input signals at its A and C inputs and produces output signals at its B and D outputs. For example, the input signals may be the signal to be transmitted and the phase shifted version of the signal to be transmitted shown in FIG. 2. The signals output from the outputs B and D may be coupled to elements of the antenna arrays 104 and 106, respectively.

As shown in FIG. 4, the input A is coupled to receive an input signal with zero phase shift, and the input C is coupled to receive a phase shifted version of the input signal, which is shift in phase by ($\phi$). The phase shift ($\phi$) is set by the phase shifters 210, 212, 214, and 216 shown in FIG. 2 and controls the allocation of power between the antennas 104 and 106 to achieve the power distributions represented by the equations shown in FIG. 4. For example, when ($\phi$) is set to provide 0, 180, or 90 degrees of phase shift, the following power distributions between the antenna 104 and the antenna 106 are provided.

Figure 5:
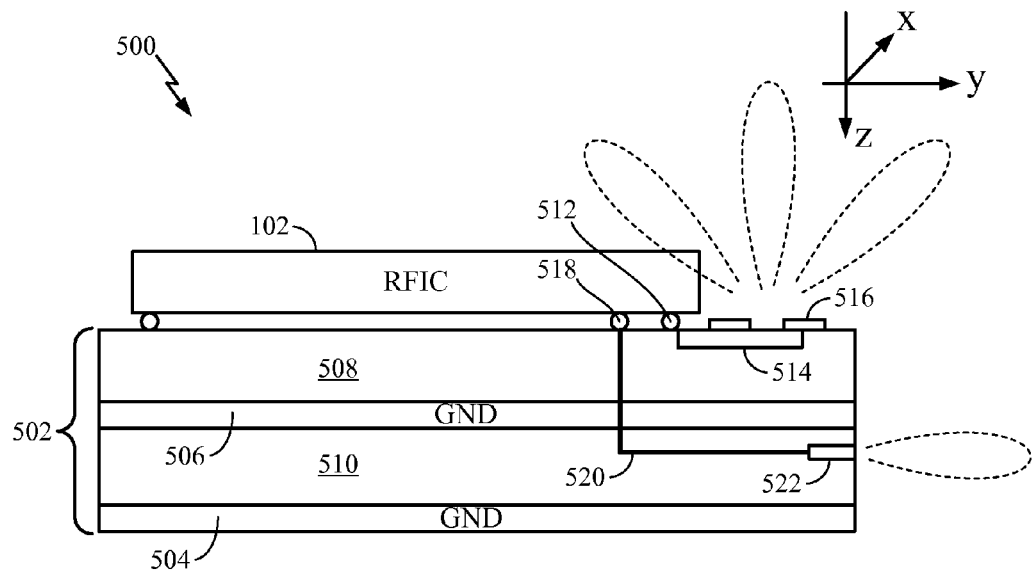
FIG. 5 shows a side view of the exemplary embodiment of a MM wave reconfigurable multi-beam antenna array shown in FIG. 1.

If $\phi=0$ then, B=0, D=$\sqrt{2}ae^{-j90°}$ to side antenna (106)
If $\phi=180$ then, D=0, B=$\sqrt{2}ae^{-j270°}$ to top antenna (104)
If $\phi=90$ then both antennas (104 and 106) receive equal power FIG. 5 shows a detailed side view of an exemplary embodiment of a MM wave reconfigurable multi-beam antenna array 500. The array 500 comprises a circuit board 502 made of a ground layers 504 and 506 that are located between signal layers 508 and 510, each of which may comprise multiple layers. The integrated circuit 102 is mounted on the top surface of the signal layer 508. A first MM wave antenna array is formed on a top surface of the circuit board 502, as illustrated by array element 516. A second MM wave antenna is formed on an interior surface at the edge of the circuit board 502 as illustrated by the antenna element 522. For example, the elements 516 and 522 may be part of antenna arrays 104 and 106, respectively.

A first electrical connection 512 between the circuit 102 and the signal layer 508 operates to conduct electrical signals to a circuit trace 514, which provides the signals to the element 516 of the antenna 102. A second electrical connection 518 between the circuit 102 and the signal layer 508 operates to conduct electrical signals to a circuit trace 520, which provides the signals to the element 522 of the antenna 106. By avoiding the use of mechanical switches, the antenna array 500 provides a compact cost effective mechanism to provide a reconfigurable multi-beam MM wave antenna.

Figure 6:
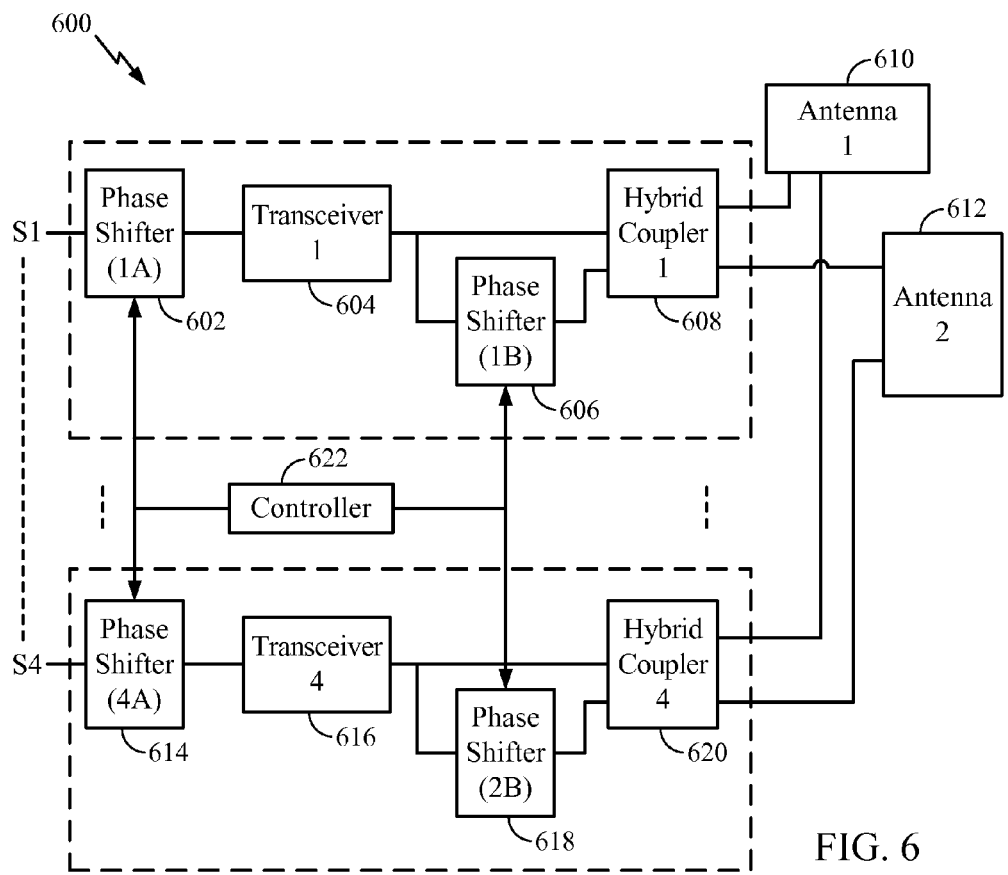
FIG. 6 shows an exemplary block diagram of a MM wave reconfigurable multi-beam antenna array.

FIG. 6 shows an exemplary block diagram of a MM wave reconfigurable multi-beam antenna array 600. The array 600 comprises four signal paths but only the first and fourth signal paths are shown in FIG. 6. The first signal path includes beam steering (BS) phase shifter 602 coupled to a first transceiver 604. The output of the first transceiver 604 is coupled to a power distribution (PD) phase shifter 606. The outputs of the first transceiver 604 and the PD phase shifter 606 are coupled to a first hybrid coupler 608. The outputs of the first hybrid coupler 608 are coupled to first antenna 610 and second antenna 612.

Similarly, the fourth signal path that includes a BS phase shifter 614, fourth transceiver 616, PD phase shifter 618 and fourth hybrid coupler 620. The output of the hybrid coupler 620 is also connected to the first antenna 610 and the antenna 612.

During operation, the PD phase shifters operate to direct power to the antennas 610 and 612. The BS phase shifters operate to control the beam steering of radiation beam patterns provided by the antennas 610 and 612.

Therefore, in exemplary embodiments an MM wave antenna array includes a side antenna array and a top antenna array. By applying on-chip phase adjustment and using hybrid couplers, the antennas can be selectively activated without the use of mechanical switches. By applying selected phase shift using PD phase shifters, power can be directed to either or both of the antenna arrays. By applying selected phase shift using the BS phase shifters, the radiation beam patterns generated by the antennas can be controlled thus providing multi-beam capability. It should be noted that the MM wave reconfigurable multi-beam antenna array 600 can operate to transmit and receive signals, such that the transmit functionality is reversed when receiving.

Figure 7:
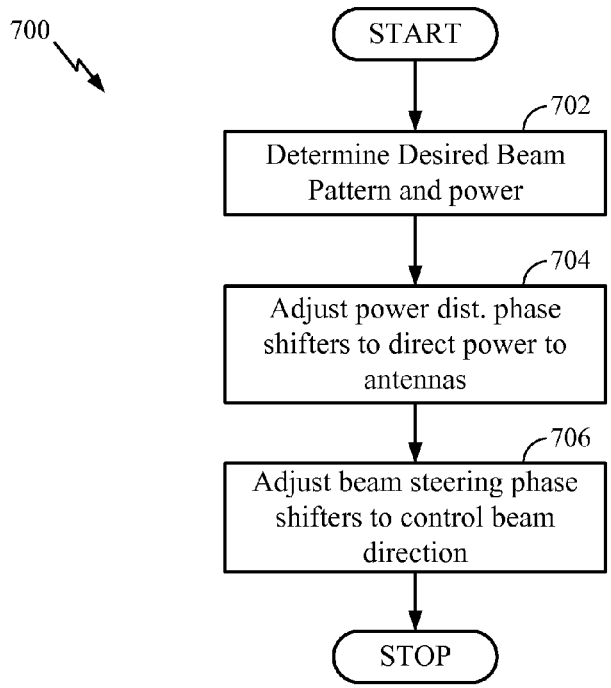
FIG. 7 shows an exemplary method for providing a MM wave reconfigurable multi-beam antenna array.

FIG. 7 shows a method for providing a MM wave reconfigurable multi-beam antenna. For example, the method is suitable for use with the antenna 600 shown in FIG. 6. In an exemplary embodiment, the controller 622 comprises a CPU, processor or other device that executes one or more instructions stored in a memory to perform the functions describe below.

At block 702, a desired beam pattern and power are determined. For example, the controller 622 receives information from another device or from user input and uses this information to determine the power distribution and beam steering to be output from the antennas 610 and 612.

At block 704, power distribution phase shifters are adjusted to control how power is directed to a first and second antenna. For example, the controller 622 set the value of phase shift provided by PD phase shifters 608, 618. The amount of phase shift controls how power is directed to the antennas 610 and 612.

At block 706, beam steering phase shifters are adjusted to control a radiation beam pattern provided by a first 610 and second 612 antennas. For example, the controller 622 set the value of phase shift provided by BS phase shifters 602, 614. The amount of phase shift controls the radiation beam pattern provided by the antennas 610 and 612.

Therefore, the method 700 operates to provide a MM wave reconfigurable multi-beam antenna. It should be noted that the method 700 is just one implementation and that the operations of the method 700 may be rearranged or otherwise modified such that other implementations are possible.

Figure 8:
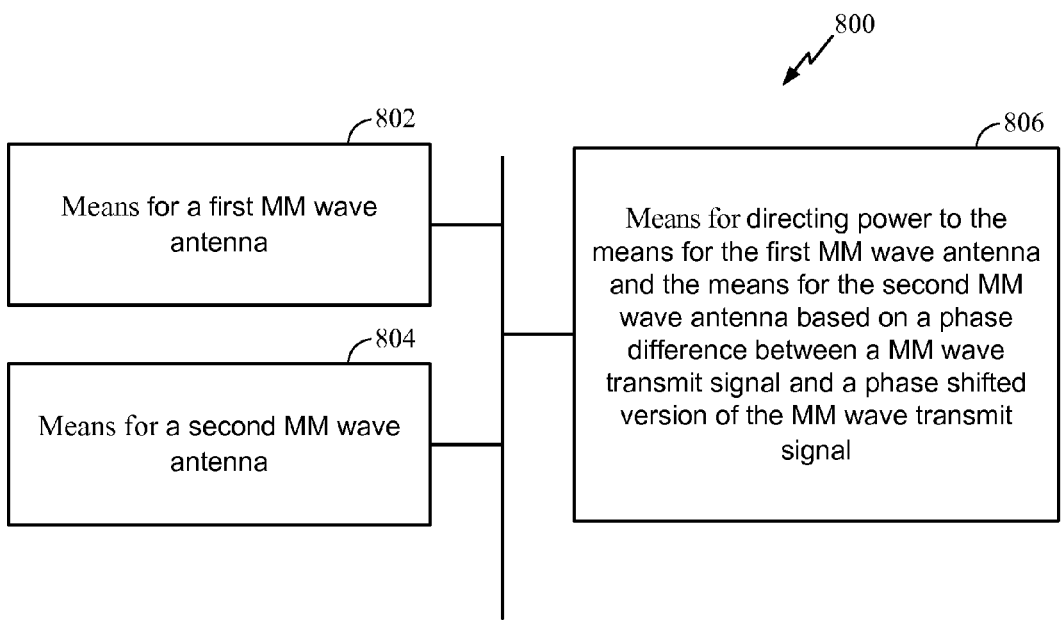
FIG. 8 shows an exemplary embodiment of an apparatus providing a MM wave reconfigurable multi-beam antenna.

FIG. 8 shows an exemplary embodiment of a MM wave reconfigurable multi-beam antenna apparatus 800. For example, the apparatus 800 is suitable for use as the MM wave antenna shown in FIG. 2. In an aspect, the apparatus 800 is implemented by one or more modules configured to provide the functions as described herein. For example, in an aspect, each module comprises hardware and/or hardware executing software.

The apparatus 800 comprises a first module comprising means (802) for a first MM wave antenna, which in an aspect comprises the antenna array 104.

The apparatus 800 also comprises a second module comprising means (804) for a second MM wave antenna, which in an aspect comprises the antenna array 106.

The apparatus 800 also comprises a third module comprising means (806) for directing power to the means for the first MM wave antenna and the means for the second MM wave antenna based on a phase difference between a MM wave transmit signal and a phase shifted version of the MM wave transmit signal, which in an aspect comprises the hybrid couplers 202, 204, 206, and 208.

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. It is further noted that transistor types and technologies may be substituted, rearranged or otherwise modified to achieve the same results. For example, circuits shown utilizing PMOS transistors may be modified to use NMOS transistors and vice versa. Thus, the amplifiers disclosed herein may be realized using a variety of transistor types and technologies and are not limited to those transistor types and technologies illustrated in the Drawings. For example, transistors types such as BJT, GaAs, MOSFET or any other transistor technology may be used.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both non-transitory computer storage media and communication media including any medium that facilitates transfer of a computer program from one place to another. A non-transitory storage media (i.e., computer program product) may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. Apparatus comprising:
   a first millimeter (MM) wave antenna to radiate a first MM wave signal having a wavelength in a range of 1 to 10 millimeters;
   a second MM wave antenna to radiate a second MM wave signal having a wavelength in a range of 1 to 10 millimeters, the second MM wave antenna having an orientation that is different from the first MM wave antenna; and
   a hybrid coupler having outputs connected to the first and second MM wave antennas, the hybrid coupler having inputs to receive a MM wave transmit signal and a phase shifted version of the MM wave transmit signal, and to direct power to the first and second MM wave antennas based on phase adjustments to the phase shifted version of the MM wave transmit signal.

2. The apparatus of claim 1, further comprising a power distribution phase shifter coupled to the hybrid coupler and configured to receive the MM wave transmit signal and produce the phase shifted version of the MM wave transmit signal.

3. The apparatus of claim 2, further comprising:
   a transceiver connected to provide the MM wave transmit signal to the hybrid coupler and the power distribution phase shifter; and
   a beam steering phase shifter coupled to receive an input signal and produce a phase shifted input signal that is input to the transceiver, the phase shifted input signal configured to adjust a beam pattern associated with the first and second MM wave antennas.

4. The apparatus of claim 3, further comprising a controller configured to control the power distribution phase shifter and the beam steering phase shifter.

5. The apparatus of claim 1, the hybrid coupler comprising a 90-degree hybrid coupler.

6. The apparatus of claim 1, the hybrid coupler comprising a 180-degree ring hybrid coupler.

7. The apparatus of claim 1, the first MM wave antenna comprising a patch antenna and configured to produce a radiation pattern in a first direction.

8. The apparatus of claim 1, the second MM wave antenna comprising an edge fire antenna and configured to produce a radiation pattern in a second direction.

9. The apparatus of claim 1, the first and second MM wave antennas formed on a circuit board.

10. The apparatus of claim 1, the first MM wave antenna comprising a plurality of first antenna elements and the second MM wave antenna comprising a plurality of second antenna elements.

11. The apparatus of claim 10, further comprising additional hybrid couplers, each hybrid coupler connected to a selected first antenna element and a selected second antenna element.

12. The apparatus of claim 11, further comprising a power distribution phase shifter coupled to each hybrid coupler, respectively, and configured to provide substantially equal amounts of phase shift.

13. The apparatus of claim 11, further comprising beam steering phase shifter coupled to each hybrid coupler, respectively, and configured to phase shift input signals to form a beam pattern.

14. Apparatus comprising:
   means for radiating a first MM wave signal having a wavelength in a range of 1 to 10 millimeters;
   means for radiating a second MM wave signal having a wavelength in a range of 1 to 10 millimeters, the means for radiating the second signal MM wave signal having an orientation that is different from the means for radiating the first MM wave signal; and
   means for coupling a received MM wave transmit signal to the means for radiating the first MM wave signal and for coupling a received phase shifted version of the MM wave transmit signal to the means for radiating the second MM wave signal, the means for coupling operable to direct power to the means for radiating the first MM wave signal and the means for radiating the second MM wave signal based on phase adjustments to the phase shifted version of the MM wave transmit signal.

15. The apparatus of claim 14, further comprising means for generating the phase shifted version of the MM wave transmit signal from the MM wave transmit signal.

16. The apparatus of claim 15, further comprising means for beam steering a beam pattern associated with the means for radiating the first MM wave signal and the means for radiating the second MM wave signal.

17. The apparatus of claim 16, further comprising means for controlling the means for coupling to control power distribution and the means for beam steering to control beam direction.

18. A method comprising:
determining a desired power distribution between first and second millimeter (MM) wave antennas that radiate MM wave signals having a wavelength in the range of 1 to 10 millimeters, the second MM wave antenna having an orientation that is different from the first MM wave antenna;
coupling a received MM wave transmit signal to the first MM wave antenna;
coupling a received phase shifted version of the MM wave transmit signal to the second MM wave antenna; and
directing power to the first and second MM wave antennas based on phase adjustments to the phase shifted version of the MM wave transmit signal.

19. The method of claim 18, further comprising:
determining a desired beam steering direction; and
adjusting a phase shift to produce the desired beam steering direction.

* * * * *